United States Patent
Wang et al.

(10) Patent No.: US 10,856,405 B2
(45) Date of Patent: Dec. 1, 2020

(54) 3D ELECTROMAGNETIC BANDGAP CIRCUIT

(71) Applicant: Realtek Semiconductor Corp., Hsinchu (TW)

(72) Inventors: Yu-Cong Wang, Taipei (TW); Ruey-Beei Wu, Taipei (TW); Shih-Hung Wang, Miaoli County (TW); Wen-Shan Wang, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 77 days.

(21) Appl. No.: 16/413,224

(22) Filed: May 15, 2019

(65) Prior Publication Data
US 2019/0357349 A1 Nov. 21, 2019

(30) Foreign Application Priority Data
May 18, 2018 (TW) .............................. 107117044 A

(51) Int. Cl.
*H05K 1/02* (2006.01)
*H01P 1/20* (2006.01)

(52) U.S. Cl.
CPC ......... *H05K 1/0236* (2013.01); *H01P 1/2005* (2013.01); *H05K 1/0231* (2013.01)

(58) Field of Classification Search
CPC .. H05K 1/0236; H05K 1/0231; H05K 1/0233; H01P 1/2005; H01P 7/082
USPC ........................................................ 333/12
See application file for complete search history.

(56) References Cited

U.S. PATENT DOCUMENTS

| 7,973,619 B2 | 7/2011 | Cho et al. |
| 2011/0114380 A1 | 5/2011 | Mok et al. |

FOREIGN PATENT DOCUMENTS

| CN | 101714681 A | 5/2010 |
| CN | 102065632 A | 5/2011 |

OTHER PUBLICATIONS

Chinese Office Action, dated Jun. 11, 2020, for Chinese Application No. 201810509925.7, with concise English explanation.

*Primary Examiner* — Robert J Pascal
*Assistant Examiner* — Kimberly E Glenn
(74) *Attorney, Agent, or Firm* — Birch, Stewart, Kolasch & Birch, LLP

(57) ABSTRACT

A 3D electromagnetic bandgap circuit includes: a dielectric layer having a first surface and an opposing second surface; a spiral element positioned on the first surface; a first surrounding element positioned on the first surface and surrounding the spiral element, but does not touch with the spiral element; a plane element positioned on the second surface and including a notch; a second surrounding element positioned on the second surface and surrounding the plane element, but does not touch with the plane element, wherein the second surrounding element further includes a protruding portion extending toward the notch; a first via passing through the dielectric layer, the spiral element, and the protruding portion; a second via passing through the dielectric layer, the plane element, and the first surrounding element; and a third via passing through the dielectric layer, the plane element, and the first surrounding element.

8 Claims, 8 Drawing Sheets

3D ELECTROMAGNETIC BANDGAP CIRCUIT

CROSS-REFERENCE TO RELATED APPLICATIONS

This application claims the benefit of priority to Patent Application No. 107117044, filed in Taiwan on May 18, 2018; the entirety of which is incorporated herein by reference for all purposes.

BACKGROUND

The disclosure generally relates to an electromagnetic bandgap structure and, more particularly, to a 3D electromagnetic bandgap circuit.

An electromagnetic bandgap structure can be utilized for suppressing the propagation of electromagnetic noises, but conventional electromagnetic bandgap structures are typically of a plane structure and thus require to occupy more circuit area.

When an electronic device does not have sufficient inner space, it will be difficult to arrange adequate quantity of electromagnetic bandgap structures within the electronic device, therefore reducing the electronic device's capacity for suppressing the propagation of electromagnetic noises.

SUMMARY

An example embodiment of a 3D electromagnetic bandgap circuit is disclosed, comprising: a dielectric layer, having a first surface and an opposing second surface; a spiral element, positioned on the first surface, wherein a head portion of the spiral element is positioned at an inner side of the spiral element, and a rear portion of the spiral element is positioned at an outer side of the spiral element; a first surrounding element, positioned on the first surface and surrounding the spiral element, but not in contact with the spiral element; a first gap, positioned between the spiral element and the first surrounding element; a plane element, positioned on the second surface and comprising a notch; a second surrounding element, positioned on the second surface and surrounding the plane element, but not in contact with the plane element, wherein the second surrounding element further comprises a protruding portion extending toward the notch; a second gap, positioned between the plane element and the second surrounding element; a first via, penetrating through the dielectric layer, the head portion, and the protruding portion; a second via, penetrating through the dielectric layer, the plane element, and the first surrounding element; and a third via, penetrating through the dielectric layer, the plane element, and the first surrounding element.

Both the foregoing general description and the following detailed description are examples and explanatory only, and are not restrictive of the invention as claimed.

DETAILED DESCRIPTION

Reference is made in detail to embodiments of the invention, which are illustrated in the accompanying drawings. The same reference numbers may be used throughout the drawings to refer to the same or like parts, components, or operations.

Figure 1:
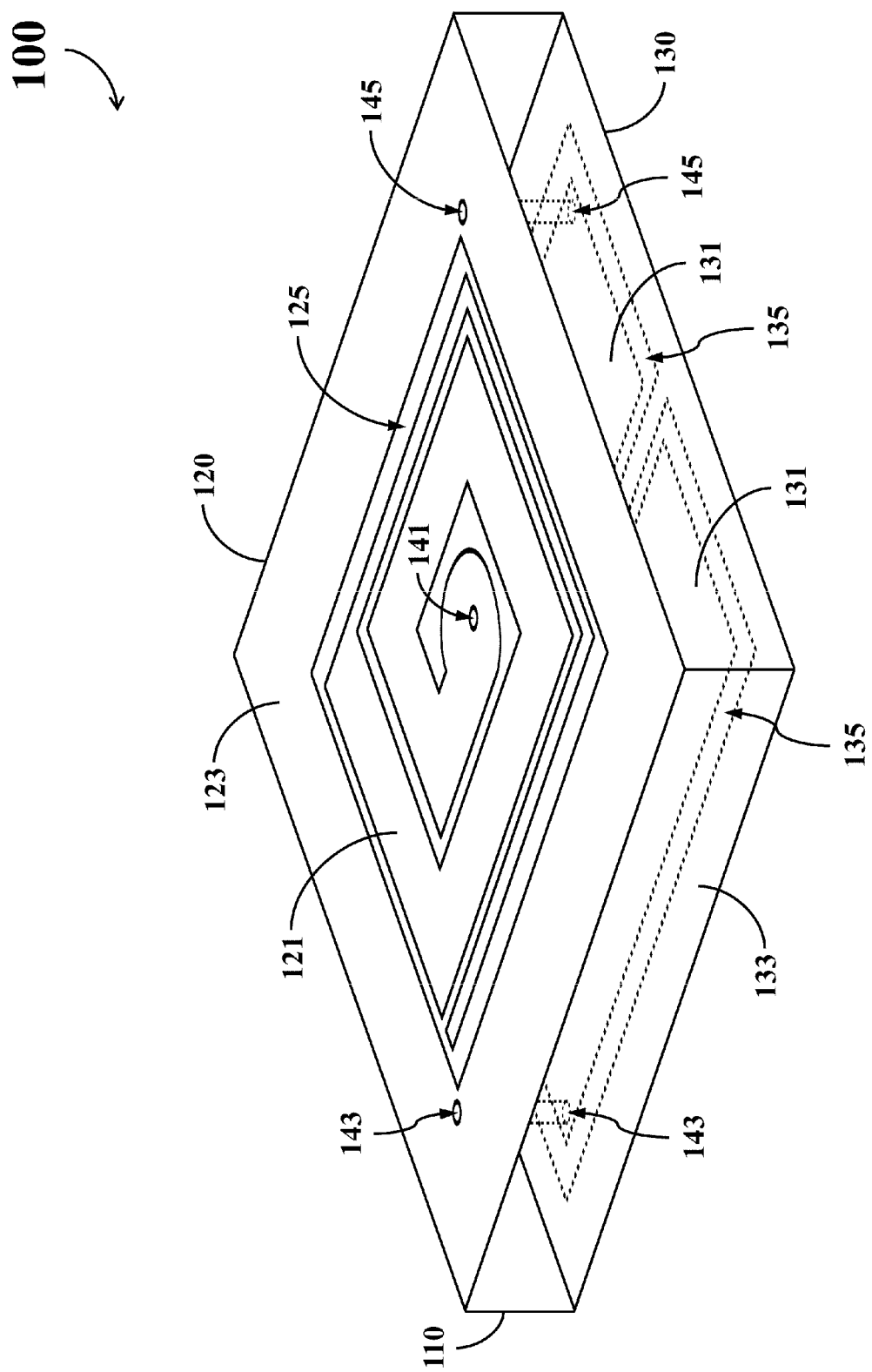
FIG. 1 shows a simplified structural schematic diagram of a 3D electromagnetic bandgap circuit according to one embodiment of the present disclosure.
Figure 2:
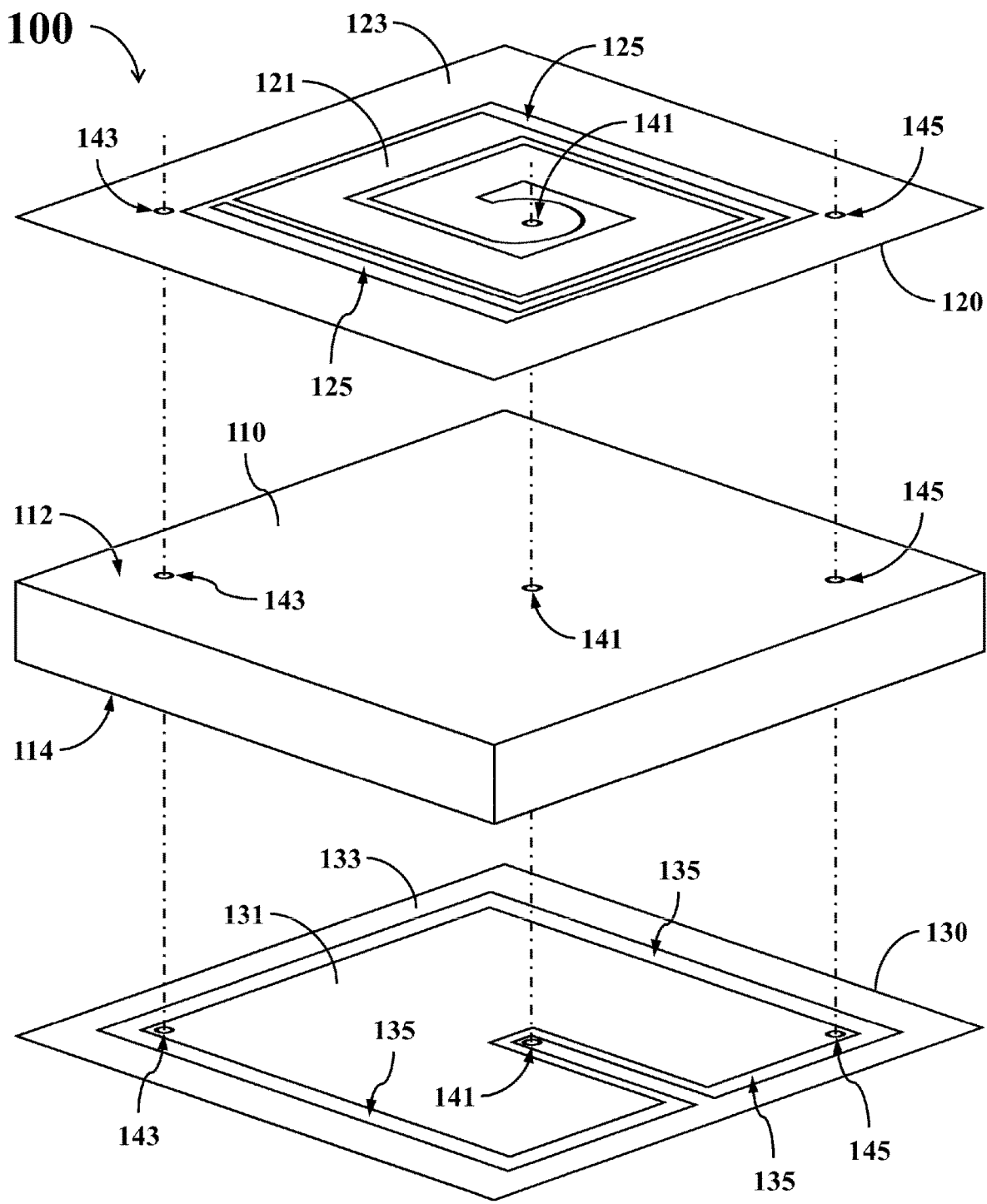
FIG. 2 shows a decomposed structural schematic diagram of the 3D electromagnetic bandgap circuit of FIG. 1.
Figure 3:
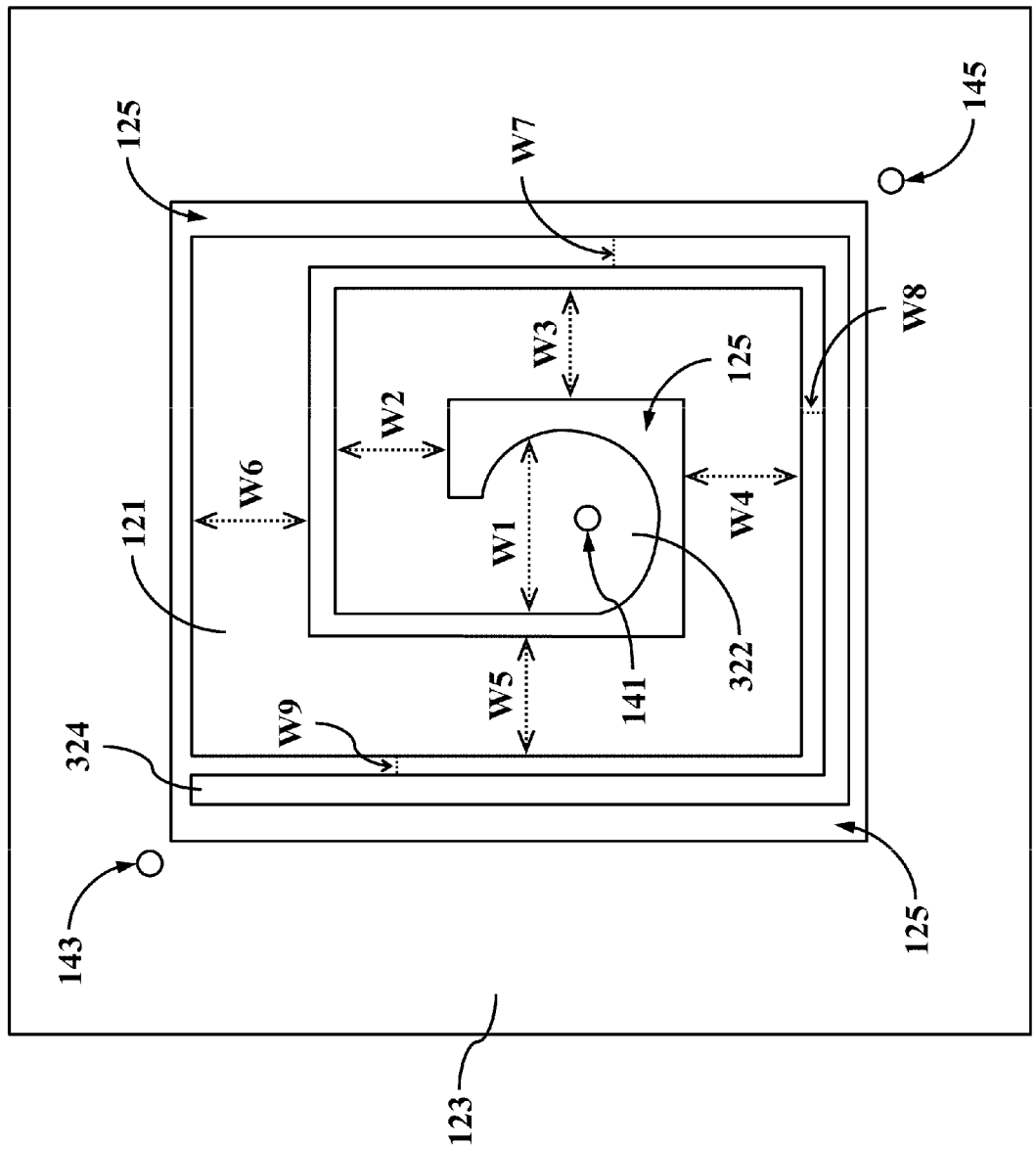
FIG. 3 shows a simplified schematic diagram of a first layer structure of the 3D electromagnetic bandgap circuit according to a first embodiment of the present disclosure.
Figure 4:
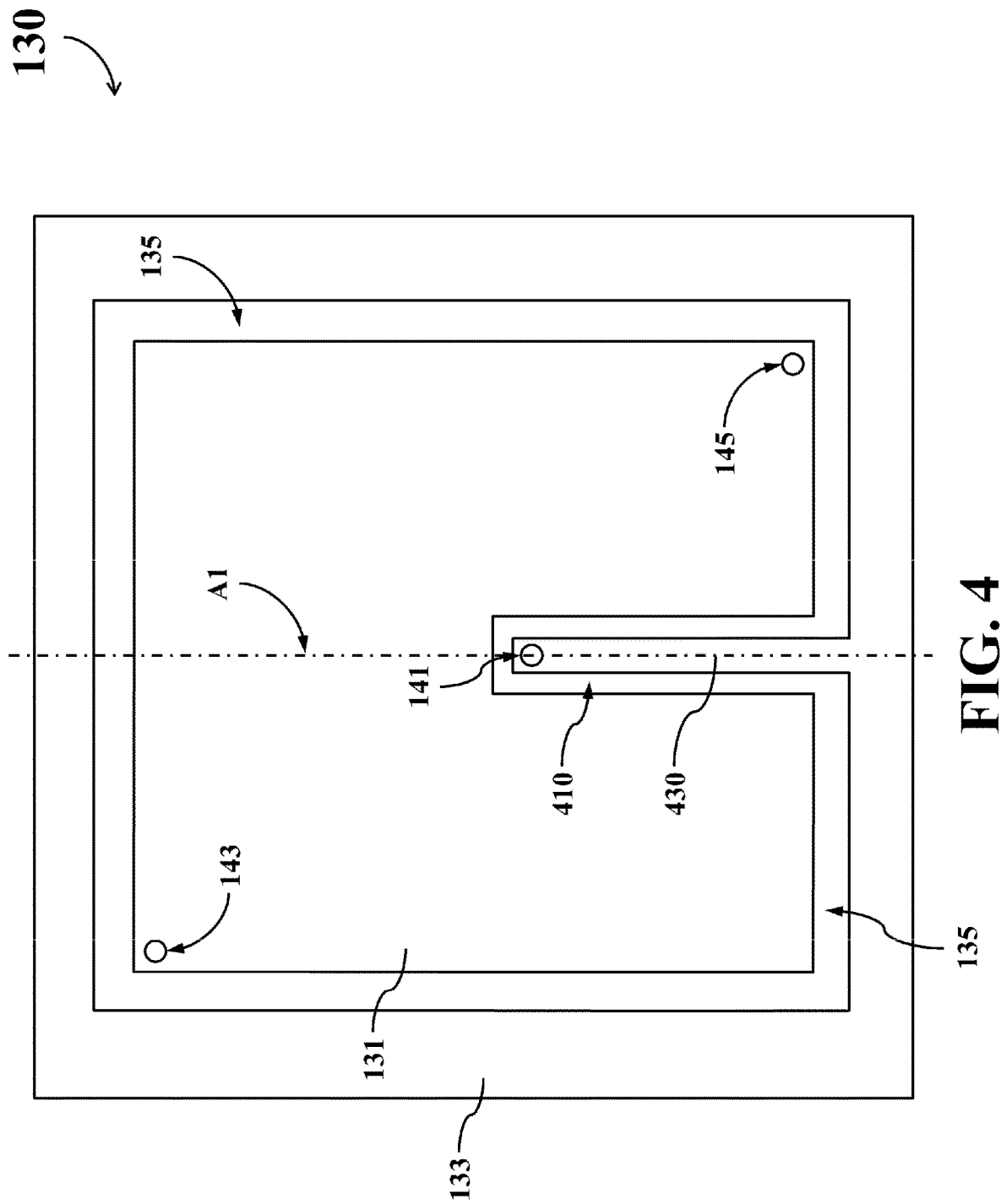
FIG. 4 shows a simplified schematic diagram of a second layer structure of the 3D electromagnetic bandgap circuit according to a first embodiment of the present disclosure.

Please refer to FIG. 1 through FIG. 4. FIG. 1 shows a simplified structural schematic diagram of a 3D electromagnetic bandgap circuit 100 according to one embodiment of the present disclosure. FIG. 2 shows a decomposed structural schematic diagram of the 3D electromagnetic bandgap circuit 100. FIG. 3 shows a simplified schematic diagram of a first layer structure 120 of the 3D electromagnetic bandgap circuit 100 according to a first embodiment of the present disclosure. FIG. 4 shows a simplified schematic diagram of a second layer structure 130 of the 3D electromagnetic bandgap circuit 100 according to a first embodiment of the present disclosure.

The 3D electromagnetic bandgap circuit 100 may be arranged in a circuit having a double-layer structure to suppress the propagation of electromagnetic noise. As shown in the drawings, the 3D electromagnetic bandgap circuit 100 comprises a dielectric layer 110, the first layer structure 120, the second layer structure 130, a first via 141, a second via 143, and a third via 145.

The dielectric layer 110 comprises a first surface 112 and an opposing second surface 114. The first layer structure 120 is positioned on the first surface 112 of the dielectric layer 110, and comprises a spiral element 121, a first surrounding element 123, and a first gap 125. The second layer structure 130 is positioned on second surface 114 of the dielectric layer 110, and comprises a plane element 131, a second surrounding element 133, and a second gap 135.

As shown in FIG. 1 through FIG. 3, in the first layer structure 120, one end of the spiral element 121 positioned at an inner side of the spiral element 121 is hereinafter referred to as a head portion 322, while another end of the spiral element 121 positioned at an outer side of the spiral element 121 is hereinafter referred to as a rear portion 324. The first surrounding element 123 surrounds the spiral element 121 but does not touch the spiral element 121. The first gap 125 is positioned between the spiral element 121 and the first surrounding element 123 to be an isolation structure between the spiral element 121 and the first surrounding element 123.

In the 3D electromagnetic bandgap circuit 100, the width of an inner portion of the spiral element 121 is purposefully designed to be longer than the width of an outer portion of the spiral element 121. The purpose of such configuration is to render the 3D electromagnetic bandgap circuit 100 to be capable of simultaneously suppressing electromagnetic noises in two frequency bands.

For example, as shown in FIG. 3, the width of the head portion 322 of the spiral element 121 is apparently longer than the width of the rear portion 324 of the spiral element 121. In FIG. 3, W1~W6 denote the respective average widths of several coil segments closer to the inner portion of the spiral element 121 (i.e., closer to the head portion 322), while W7~W9 denote the respective average widths of several coil segments closer to the outer portion of the spiral element 121 (i.e., closer to the rear portion 324).

In practice, the widths W1~W6 may be designed to be identical to each other or may be designed to be slightly different from each other. Similarly, the widths W7~W9 may be designed to be identical to each other or may be designed to be slightly different from each other.

It can be appreciated from FIG. 3 that the average widths W1~W6 of the coil segments closer to the inner portion of the spiral element 121 are apparently larger than the average widths W7~W9 of the coil segments closer to the outer portion of the spiral element 121.

As shown in FIG. 4, the plane element 131 of the second layer structure 130 comprises a notch 410. The second surrounding element 133 surrounds the plane element 131 but does not touch the plane element 131. In addition, the second surrounding element 133 further comprises a protruding portion 430 extending toward the notch 410. The second gap 135 is positioned between the plane element 131 and the second surrounding element 133 to be as an isolation structure between the plane element 131 and the second surrounding element 133.

As shown in FIG. 1 through FIG. 4, the first via 141 penetrates through the dielectric layer 110, the head portion 322 of the spiral element 121, and the protruding portion 430 of the plane element 131 and is utilized for electronically coupling the head portion 322 with the protruding portion 430. The second via 143 penetrates through the dielectric layer 110, the plane element 131, and the first surrounding element 123, and is utilized for electronically coupling the plane element 131 with the first surrounding element 123. The third via 145 penetrates through the dielectric layer 110, the plane element 131, and the first surrounding element 123, and is utilized for electronically coupling the plane element 131 with the first surrounding element 123.

In practice, the first via 141 may (but not limited to) be arranged at a center position of the first layer structure 120. For example, as shown in FIG. 3, the first via 141 is arranged within a central area of the first layer structure 120, but is not at the center position of the first layer structure 120.

As shown in FIG. 4, the notch 410 of the plane element 131 extends from the edge of the plane element 131 toward the inner portion of the plane element 131 substantially along a first axis A1. From another aspect, the protruding portion 430 of the second surrounding element 133 also extends from the edge of an inner portion of the second surrounding element 133 toward the notch 410 substantially along the first axis A1.

In this embodiment, the foregoing second via 143 and the third via 145 are respectively positioned at two sides of the first axis A1, and respectively positioned near two ends of a diagonal of the plane element 131.

In practice, the dielectric layer 110 may be made with various insulation materials. Each of the spiral element 121, the first surrounding element 123, the plane element 131, and the second surrounding element 133 may be made with various suitable conductive materials.

In addition, each of the first gap 125 and the second gap 135 may be realized with a void structure, or may be realized with a physical spacing structure made by insulation materials.

When the 3D electromagnetic bandgap circuit 100 is arranged on a circuit board, the spiral element 121 or the second surrounding element 133 may be utilized for coupling with a ground voltage, while the first surrounding element 123 or the plane element 131 may be utilized for coupling with a supply voltage.

When the foregoing first layer structure 120 is coupled with the second layer structure 130 through the vias 141~145, a flipped electromagnetic bandgap resonance structure would be created, so that the 3D electromagnetic bandgap circuit 100 can be utilized for simultaneously suppressing the electromagnetic noises in two frequency bands.

For example, if the 3D electromagnetic bandgap circuit 100 needs to suppress the electromagnetic noises in both 2.45 GHz frequency band and 5.3 GHz frequency band, the length of the foregoing first surrounding element 123 may be designed to be within 3.75~5.5 mm and the width of the first surrounding element 123 may be designed to be within 4.5~6.5 mm, the length of the second surrounding element 133 may be designed to be within 4.5~6.5 mm, while the width of the second surrounding element 133 may be designed to be within 4.5~6.5 mm.

It can be appreciated from the foregoing elaboration that the 3D electromagnetic bandgap circuit 100 is realized with a three-dimensional multi-layered structure, and thus can effectively reduce the required circuit area.

In addition, since a single 3D electromagnetic bandgap circuit 100 can be utilized to simultaneously suppress the electromagnetic noises in two frequency bands, the 3D electromagnetic bandgap circuit 100 is very suitable to be employed in the electronic device that requires to transmit and receive signals in two different frequency bands.

The 3D electromagnetic bandgap circuit 100 uses a flipped structure, therefore it can be applied on the circuit board of double-layered structure without increasing the quantity of layers of the circuit board.

Furthermore, even if the arrangement of multiple 3D electromagnetic bandgap circuits 100 does not have a periodical pattern, the 3D electromagnetic bandgap circuits 100 can still provide desirable electromagnetic noise suppression effect. As a result, the flexibility in designing the overall circuit can be significantly increased. For example, several 3D electromagnetic bandgap circuits 100 may be arranged near a noise source in the electronic device to thereby significantly improve the electronic device's ability in terms of suppressing the propagation of electromagnetic noises suppression.

Please note that the quantity of the coil segments closer to the inner portion of the spiral element 121 and the quantity of the coil segments closer to the outer portion of the spiral element 121 are not restricted to the quantity of the embodiment in FIG. 3. In practice, the quantity of the coil segments closer to the inner portion of the spiral element 121 and the quantity of the coil segments closer to the outer portion of the spiral element 121 may be flexibly modified according to the frequency band of the electromagnetic noise to be suppressed.

In addition, the positions and the quantity of the vias in the 3D electromagnetic bandgap circuit 100 are not restricted to the position and the quantity of the embodiment in FIG. 1 through FIG. 4.

Figure 5:
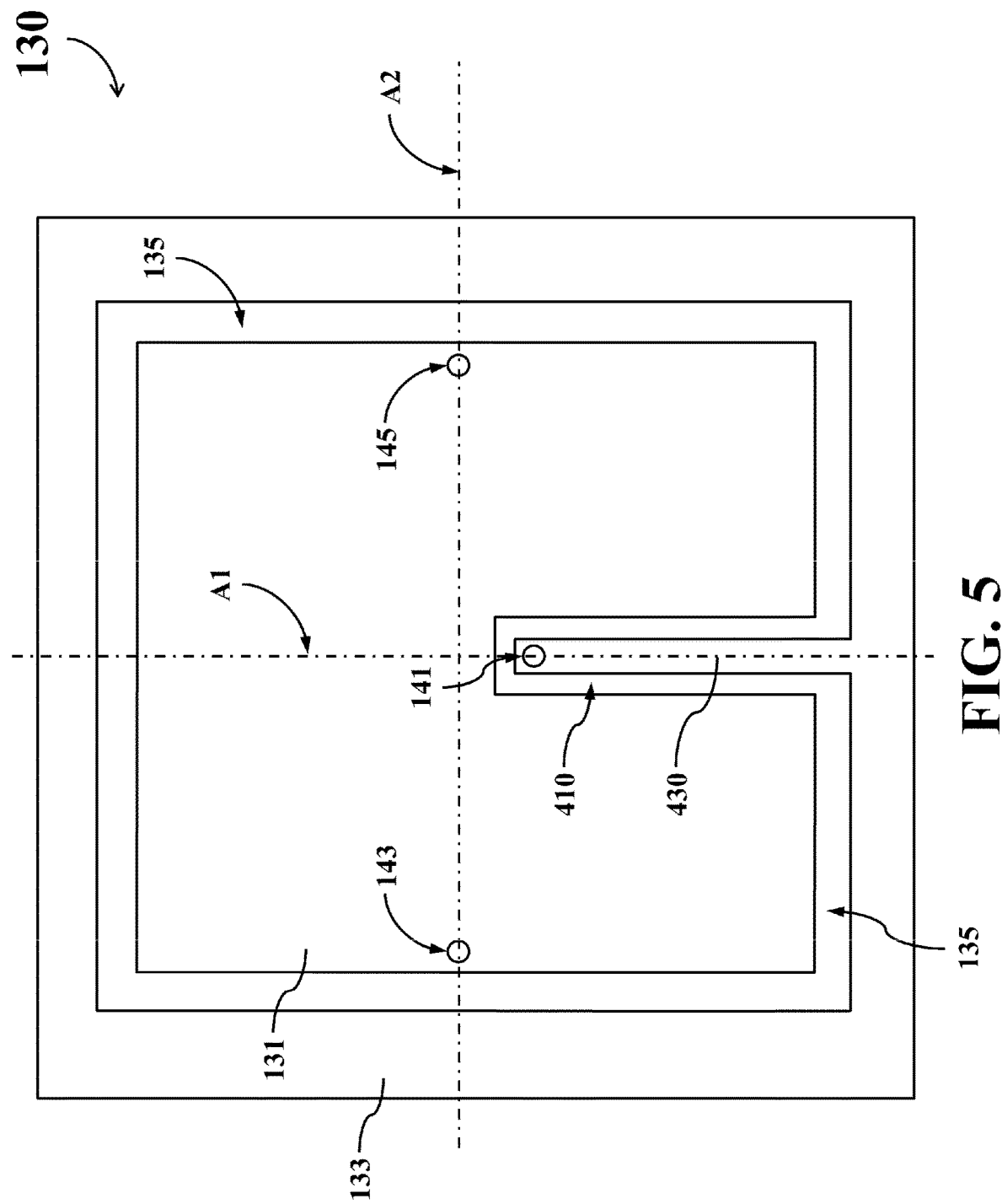
FIG. 5 shows a simplified schematic diagram of the second layer structure of the 3D electromagnetic bandgap circuit according to a second embodiment of the present disclosure.
Figure 6:
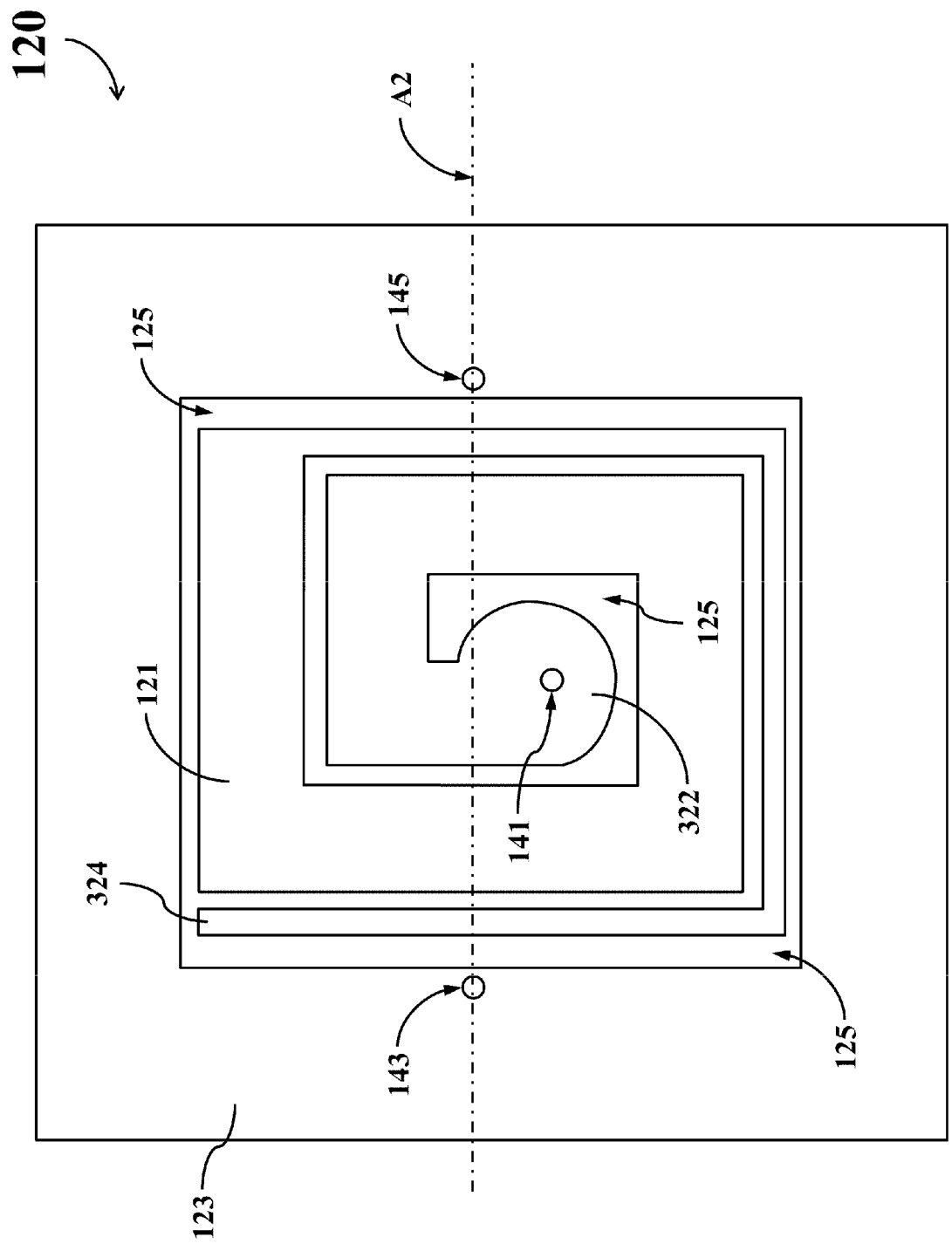
FIG. 6 shows a simplified schematic diagram of the first layer structure of the 3D electromagnetic bandgap circuit according to a second embodiment of the present disclosure.

For example, in the embodiment shown in FIG. 5 and FIG. 6, the second via 143 and the third via 145 are respectively positioned at the left-hand side and the right-hand side of the plane element 131, and both are positioned on a second axis A2 perpendicular to the first axis A1.

Figure 7:
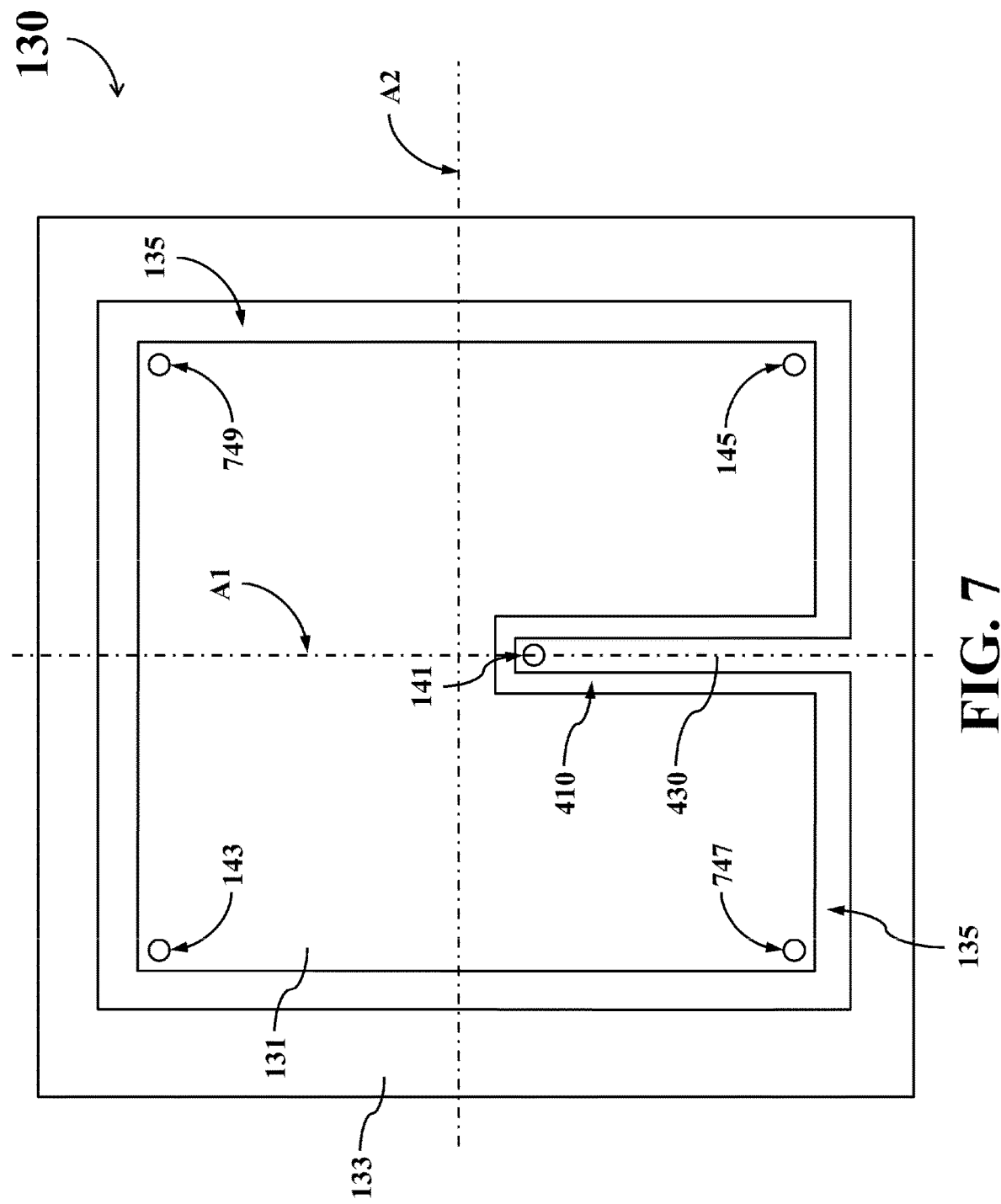
FIG. 7 shows a simplified schematic diagram of the second layer structure of the 3D electromagnetic bandgap circuit according to a third embodiment of the present disclosure.
Figure 8:
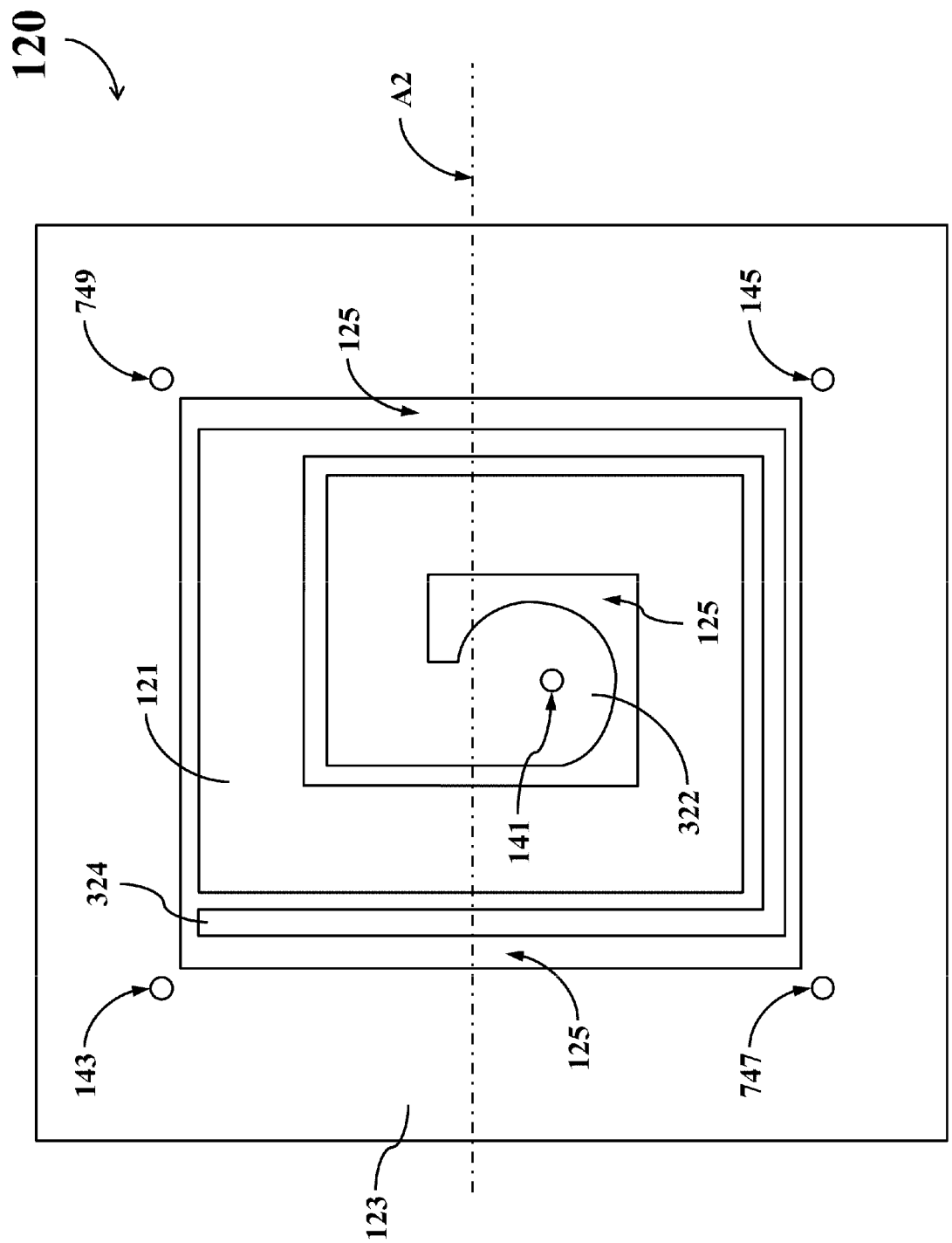
FIG. 8 shows a simplified schematic diagram of the first layer structure of the 3D electromagnetic bandgap circuit according to a third embodiment of the present disclosure.

For another example, in the embodiment shown in FIG. 7 and FIG. 8, in addition to the first via 141, the second via 143, and the third via 145, the 3D electromagnetic bandgap circuit 100 further comprises a fourth via 747 and a fifth via 749.

As shown in FIG. 7 and FIG. 8, the fourth via 747 and the fifth via 749 both penetrate the dielectric layer 110, the plane element 131, and the first surrounding element 123.

In the embodiment shown in FIG. 7 and FIG. 8, the second via 143 and the third via 145 are respectively positioned at two sides of the first axis A1, and respectively positioned near two ends of one diagonal of the plane element 131, while the fourth via 747 and the fifth via 749 are respectively positioned at two sides of the first axis A1, but respectively positioned near two ends of another diagonal of the plane element 131. In other words, the fourth via 747 and the second via 143 are positioned at one side of the first axis A1, and the fifth via 749 and the third via 145 are positioned at another side of the foregoing first axis A1.

Please note that the multiple coil segments of the spiral element 121 may be instead designed to have a more rounded shape in practical implementations, and not restricted to the pattern shown in the previous embodiments.

In addition, the shape and size of both the first surrounding element 123 and the second surrounding element 133 are not restricted to be the same.

For example, the shape of both the first surrounding element 123 and the second surrounding element 133 may be designed to be square, but with different side lengths.

For another example, the first surrounding element 123 and the second surrounding element 133 may be designed to have different lengths and/or different widths.

Certain terms are used throughout the description and claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple", phrases "be coupled with," "couples with," and "coupling with" are is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Throughout the description and claims, the term "element" contains the concept of component, layer, or region.

In the drawings, the size and relative sizes of some elements may be exaggerated or simplified for clarity.

Accordingly, unless the context clearly specifies, the shape, size, relative size, and relative position of each element in the drawings are illustrated merely for clarity, and not intended to be used to restrict the claim scope. In addition, the present disclosure may be embodied in various forms. The explanation of the present disclosure should not be restricted to embodiments in the description.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

The foregoing is only one better embodiment of the present disclosure. The equivalent change or modification of the claims of the present disclosure fall within the scope of the present disclosure.

What is claimed is:

1. A 3D electromagnetic bandgap circuit (100), comprising:
    a dielectric layer (110), having a first surface (112) and an opposing second surface (114);
    a spiral element (121), positioned on the first surface (112), wherein a head portion (322) of the spiral element (121) is positioned at an inner side of the spiral element (121), and a rear portion (324) of the spiral element (121) is positioned at an outer side of the spiral element (121);
    a first surrounding element (123), positioned on the first surface (112) and surrounding the spiral element (121), but not in contact with the spiral element (121);
    a first gap (125), positioned between the spiral element (121) and the first surrounding element (123);
    a plane element (131), positioned on the second surface (114) and comprising a notch (410);
    a second surrounding element (133), positioned on the second surface (114) and surrounding the plane element (131), but not in contact with the plane element (131), wherein the second surrounding element (133) further comprises a protruding portion (430) extending toward the notch (410);
    a second gap (135), positioned between the plane element (131) and the second surrounding element (133);
    a first via (141), penetrating through the dielectric layer (110), the head portion (322), and the protruding portion (430);
    a second via (143), penetrating through the dielectric layer (110), the plane element (131), and the first surrounding element (123); and
    a third via (145), penetrating through the dielectric layer (110), the plane element (131), and the first surrounding element (123).

2. The 3D electromagnetic bandgap circuit (100) of claim 1, wherein a width of an inner portion of the spiral element (121) is greater than a width of an outer portion of the spiral element (121).

3. The 3D electromagnetic bandgap circuit (100) of claim 2, wherein the notch (410) extends from an edge of the plane element (131) toward an inner portion of the plane element (131) substantially along a first axis (A1), while the second via (143) and the third via (145) are respectively positioned at two sides of the first axis (A1).

4. The 3D electromagnetic bandgap circuit (100) of claim 3, further comprising:
- a fourth via (747), penetrating through the dielectric layer (110), the plane element (131), and the first surrounding element (123); and
- a fifth via (749), penetrating through the dielectric layer (110), the plane element (131), and the first surrounding element (123);
- wherein the fourth via (747) and the second via (143) are positioned at one side of the first axis (A1), while the fifth via (749) and the third via (145) are positioned at another side of the first axis (A1).

5. The 3D electromagnetic bandgap circuit (100) of claim 2, wherein the protruding portion (430) extends from an inner side of the second surrounding element (133) toward the notch (410) substantially along a first axis (A1), while the second via (143) and the third via (145) are respectively positioned at two sides of the first axis (A1).

6. The 3D electromagnetic bandgap circuit (100) of claim 5, further comprising:
- a fourth via (747), penetrating through the dielectric layer (110), the plane element (131), and the first surrounding element (123); and
- a fifth via (749), penetrating through the dielectric layer (110), the plane element (131), and the first surrounding element (123);
- wherein the fourth via (747) and the second via (143) are positioned at one side of the first axis (A1), while the fifth via (749) and the third via (145) are positioned at another side of the first axis (A1).

7. The 3D electromagnetic bandgap circuit (100) of claim 2, wherein a width of the head portion (322) is greater than a width of the rear portion (324).

8. The 3D electromagnetic bandgap circuit (100) of claim 2, wherein the spiral element (121) or the second surrounding element (133) is utilized for coupling with a ground voltage, and the first surrounding element (123) or the plane element (131) is utilized for coupling with a supply voltage.

\* \* \* \* \*